United States Patent [19]

Uchida

[11] 4,236,170
[45] Nov. 25, 1980

[54] GATE CONTROLLED NEGATIVE RESISTANCE SEMICONDUCTOR DEVICE

[75] Inventor: Yukimasa Uchida, Yokohama, Japan

[73] Assignee: Tokyo Shibaura Denki Kabushiki Kaisha, Kawasaki, Japan

[21] Appl. No.: 41,883

[22] Filed: May 23, 1979

[30] Foreign Application Priority Data

May 31, 1978 [JP] Japan .................. 53-64286
May 31, 1978 [JP] Japan .................. 53-64287
May 31, 1978 [JP] Japan .................. 53-64288

[51] Int. Cl.³ .................................... H01L 29/66
[52] U.S. Cl. .......................... 357/57; 357/21; 357/23; 357/55; 357/89; 357/90; 357/91
[58] Field of Search ............. 357/21, 23, 55, 57, 357/89, 90, 91

[56] References Cited

U.S. PATENT DOCUMENTS 3,654,531  4/1972  Krambeck et al. ............. 357/57

OTHER PUBLICATIONS

Solid State Elec.—vol. 9, pp. 783–806, A. S. Grove et al. 1966.
IEEE Jour. Solid State Circuits—vol. SC-11, No. 1, pp. 58–63, Tasch et al., Feb. 1976.

Primary Examiner—Edward J. Wojciechowicz
Attorney, Agent, or Firm—Oblon, Fisher, Spivak, McClelland & Maier

[57] ABSTRACT

A negative resistance semiconductor device comprises at least one negative resistance semiconductor element. The negative resistance semiconductor element includes a first region of N type and a second region of P type for forming a PN junction. A conductive electrode is provided on an insulating layer on the first region and is electrically coupled with the second region. First and second terminals are connected to the first and second regions, respectively. A region doped with an impurity of N type is provided on the surface of a subregion of the first region between the PN junction and the remaining subregion of the first region, and a region doped with an impurity of the P type is formed on the subregion. A negative resistance characteristics is obtained when a reverse bias voltage of a predetermined range is applied between the first and second terminals.

10 Claims, 17 Drawing Figures

GATE CONTROLLED NEGATIVE RESISTANCE SEMICONDUCTOR DEVICE

BACKGROUND OF THE INVENTION

The present invention relates to a negative resistance semiconductor device well adapted for integrated circuit fabrication.

A negative resistance semiconductor device, which is used for amplification, oscillation and power control, is roughly classified into a voltage control type device and a current control type device. In the voltage control type device, current flowing through a semiconductor element varies tracing an N-shaped curve with respect to a voltage applied to a negative resistance semiconductor element constituting the negative resistance semiconductor device. The semiconductor device of this type having been put into practice is only the EZAKI diode. In the case of the EZAKI diode, even if the PN junction area is designed to be in the order of 20μ of its diameter, current flowing through the diode is about 1 to 5 mA. Therefore, it is very difficult to integrate a number of EZAKI diodes in an integrated circuit. It is for this reason that no attempt of its integrated fabrication has been made.

Accordingly, an object of the invention is to provide a negative resistance semiconductor device including at least one negative resistance semiconductor element which is adaptable for integrated fabrication and consumes little power.

SUMMARY OF THE INVENTION

A negative resistance semiconductor element constituting a negative resistance semiconductor device according to the invention is comprised of: first and second semiconductor regions of first and second conductivity types, these forming a PN junction; a conductive electrode which is provided at least on the surface of the first semiconductor region with an insulating layer intevening therebetween, and is electrically coupled with the second semiconductor region; a first terminal connected to the first semiconductor region; a second terminal connected to the second semiconductor region; structual means which provides a first positive resistance characteristic at the PN junction when an inverse bias voltage of a first voltage range is applied across the PN junction through the first and second terminals, provides a negative resistance characteristic at the PN junction when an inverse bias voltage of a second voltage range is applied thereacross, and provides a second positive resistance characteristic across the PN junction when an inverse voltage of a third voltage range is applied thereacross. The first positive resistance characteristic is obtained by forming a depletion layer continuous from the PN junction to the surface of the first semiconductor region adjacent the conductive electrode, and the negative resistance characteristic is obtained by forming an invension layer of the second conductivity type which is on the depletion layer formed on the surface of the first semiconductor region adjacent the conductive electrode and is at a location separated from the PN junction.

The semiconductor device according to the invention may be comprised of the negative resistance semiconductor element mentioned above. When the device of the invention is connected to a word line and a bit line through a switching MOS transistor, a memory cell may be constructed.

Other objects and features of the invention will be apparent from the following description taken in connection with the accompanying drawings, in which:

DETAILED DESCRIPTION OF THE PREFERRED EMBODIMENTS

Figure 1:
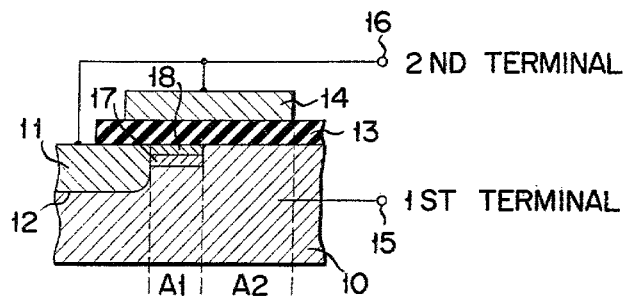
FIG. 1 shows a cross sectional view of a first embodiment of a negative resistance semiconductor device according to the invention.

Reference is first made to FIG. 1. Boron, for example, is diffused on the surface region of a first semiconductor region 10, for example, an N-type semiconductor region 10, to form a P-type second semiconductor region 11. In this way, a PN junction 12 is formed. In this example, the impurity concentration of the first region 10 is $10^{15}$ cm$^{-3}$ and that of the second region 11 is $5 \times 10^{19}$ cm$^{-3}$. A conductive electrode 14 of about 3000 Å such as a polycrystal silicon electrode is provided above a part of the second region 11 and the first region 10, by way of an insulating layer 13 of about 1000 Å such as an silicon oxide film. The insulating layer 13 may be made of silicon nitride, almina or any other suitable material. The conductive electrode 14 may be aluminum, molybdenum or the like. The P-type region 11 and the polycrystal silicon electrode 14 are electrically connected to each other. The N-type region 10 is connected to a first terminal 15 and the P-type region 11 is connected to a second terminal 16. The electrode 14 must be formed at least above the N-type region 10 and the PN junction 12. For easy of explanation, the surface of N-type region 10 is separated into two regions; a region A1 adjacent to the PN junction 12 and a region A2 adjacent to the A1 region but separated from the PN junction. In this example, two kinds of ions are implanted into the surface region of the region A1 to form impurity regions 17 and 18. The impurity ions implanted into the region 17 is of the same type (N-type) as that of the region 10 and has an amount of $N_1$. The impurity ions implanted into the region 18 is of the type different from that of the region 10 and has an amount of $N_2$. These impurity amounts $N_1$ and $N_2$ are related by $N_1 > N_2$. In this example, the impurity region 17 is formed by implanting phosphorus of $4 \times 10^{11}$ cm$^{-2}$ into the N-type region 10 and the impurity region 18 by implanting boron of $2 \times 10^{11}$ cm$^{-2}$. The reason why the impurity regions 17 and 18 are formed in the region A1 is that, when an inverse bias is applied across the PN junction 12 through the first and second terminals 15 and 16, the provision of such regions 17 and 18 enables one to control the voltage dependency of the surface potential of the region 10, i.e. the surface potential dependancy with respect to a voltage applied to the conductive electrode 14.

Such a technique to control the gate voltage dependancy of the surface potential of a region under a gate electrode by doping two different conductivity ions into the surface region of a semiconductor, is disclosed, for example, in IEEE Journal of solid State Circuit, Vol. SC-11, No. 1, Feb. 1976, pp. 58 to 63.

The operation of the device shown in FIG. 1 will be described with reference to FIGS. 2A to 2C, and FIG. 3. For easy of description, it is assumed that a fixed voltage, e.g. +5 V, is applied to the 1st terminal 15, and a variable DC voltage $V_G$ which is adjustable from 0 to 5 V, for example, is applied to the terminal 16. In a graph shown in FIG. 3, an X-axis represents the DC voltage $V_G$ applied to the 2nd terminal 16 and a Y-axis represents a current flowing through the P-N junction 12.

Phase I ranging 4.5 to 5 V of $V_G$

Figure 2A:
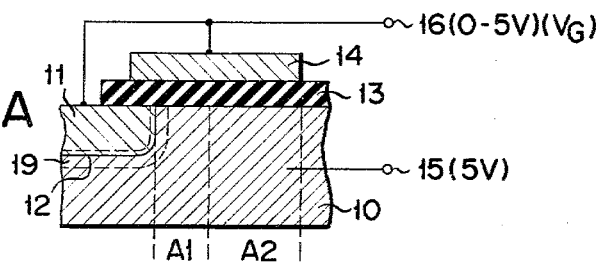
FIGS. 2A to 2C show a series of cross sectional views for illustrating a characteristic of the element shown in FIG. 1.
Figure 2B:
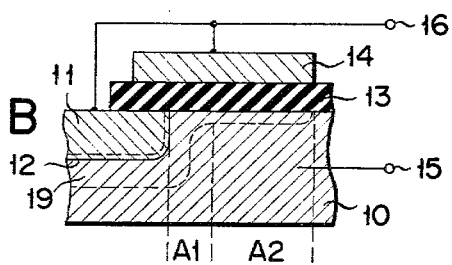
Figure 2C:
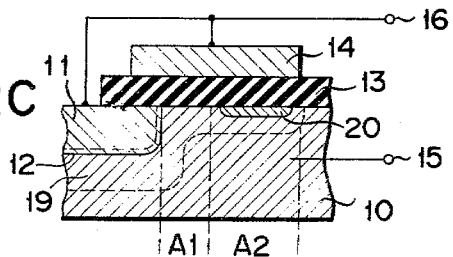

In this phase, an inverse voltage across the PN junction 12 is between 0 to 0.5 V, and a depletion layer 19 is formed only in the vicinity of the PN junction 12 (FIG. 2A). Under this condition, the semiconductor region under the electrode 14 acts as a accumulation layer, thus permitting a small inverse current to flow therethrough. See FIG. 3, phase I.

Phase II ranging 3.5 to 4 V of $V_G$

Figure 3:
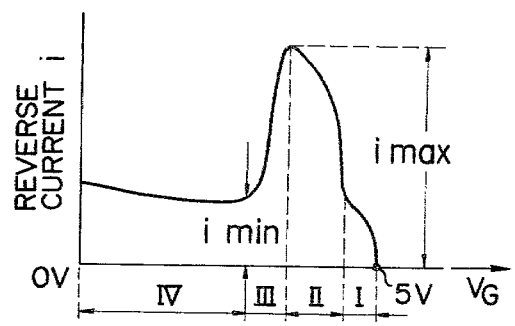
FIG. 3 shows a voltage versus current characteristic of the element shown in FIG. 1.

When the DC voltage $V_G$ is regulated to a voltage range from 3.5 to 4 V, an inverse voltage applied across the PN junction 12 falls within a voltage range 1 to 1.5 V. Under this condition, the depletion layer 19 grows into the surfaces of the regions A1 and A2, as indicated by a dotted line in FIG. 2B. As a result, an inverse current i flowing through the PN junction 12 continuously increases, as shown in FIG. 3, phase II. The reason is that a surface generation current larger than a current due to the recombination generation centers in the bulk of the region 10 is produced due to high density surface recombination generating centers and that the surface generation current flows into the P region 11. The surface generation current increases as the inverse voltage increases. As previously mentioned, the provision of the impurity layers 17 and 18 causes the surface potentials of the region 11, region A1 and region A2 to be higher in the order mentioned. Accordingly, no potential barrier is present in the current flow path and hence the inverse current i increases in the manner as shown in FIG. 3, phase II.

Phase III ranging 3.0 to 3.5 V of $V_G$

When the DC voltage $V_G$ is controlled to a voltage range from 3.0 to 3.5 V, the inverse bias applied to the PN junction 12 falls within a range between 1.5 to 2 V. Under this condition, the inverse current i gradually decreases as shown in phase III of FIG. 3. The reason for this is that the formation of the impurity layers 17 and 18 causes the surface potentials of the region 11, region A2 and region A1 to be higher in the order mentioned. Accordingly, the potential barrier at the region A1 blocks the flow of charge, with the result that an inversion layer 20, i.e. an N conductivity layer, is formed in the region A2. Thus, the inversion layer of P type takes place only in the region A2 of the depletion layer 19 to reduce the surface area of the depletion layer (that under the electrode 14) where the surface regeneration current is produced. The reduction of the surface area of the depletion layer due to the inversion layer and the presence of the potential barrier in the region A1 cause a current flowing into the P type region 11 via the junction 12 to decrease in a manner as shown in FIG. 3, phase III.

Phase IV below 3 V of $V_G$

When the DC voltage is controlled below 3 V, the inverse voltage applied accross the PN junction 12 becomes above 2 V. The current flowing into the P type region 11 by way of the PN junction 12 is mainly comprised of an ordinary inverse current caused by carriers generated in the depletion layer extending over the bulk. See Phase IV in FIG. 3.

In order to provide the negative resistance characteristic (Phase III in FIG. 3), it is important that the surface generation current on the surface of the region 10 is larger than the generation current in the bulk of the region 10. However, this condition may readily be attained by using an ordinary MOS transistor manufacturing technique. The phenomenon that the decrease of the surface generation current in the inversion layer is described in "Physics and Technology of Semiconductor Devices" by A. S. Grove, published by John Wiley and Sons, Inc. pp. 298 to 305. The literature does not teach a structure of a semiconductor element exhibiting a negative resistance characteristic between two terminals.

The maximum current $i_{max}$ of the current i shown in FIG. 3 depends on the density of the recombination centers in the region 10 and an area of the conductive electrode 14 corresponding to the surface of the region 10. On the other hand, the minimum current $i_{min}$ depends on the density of the recombination generation centers in the bulk of the region 10 and its impurity concentration.

Figure 4:
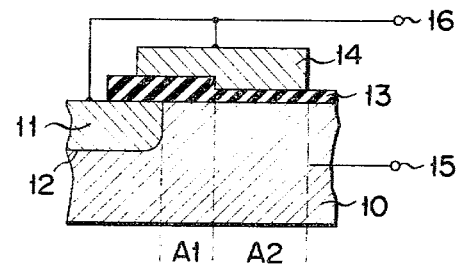
FIG. 4 shows a cross sectional view of a second embodiment of a negative resistance semiconductor device according to the invention.
Figure 5:
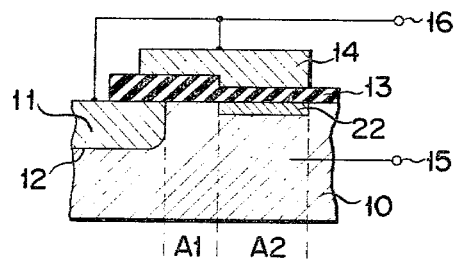
FIG. 5 shows a cross sectional view of a third embodiment of negative resistance semiconductor device according to the invention.
Figure 6:
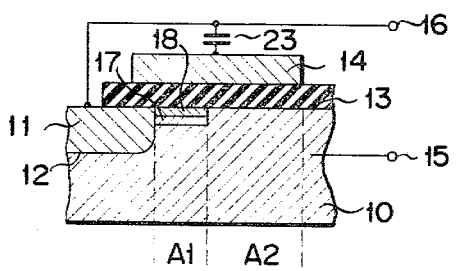
FIG. 6 shows a cross sectional view of a fourth embodiment of a device according to this inventions.

In the above example, the impurity regions 17 and 18 are formed in the region A1 shown in FIG. 1 by an ion implantation technique. The negative resistance characteristic is also attainable when the silicon oxide layer on the region A1 is made thicker than the silicon oxide layer on the region A2. This is attainable under a physical condition, for example, that the impurity concentration of the first region 10 is $10^{16}$ cm$^{-3}$, the thickness of the silicon oxide layer on the region A1 is 800 Å and the thickness of the silicon oxide layer on the region A2 is 400 Å (FIG. 4). In a further alternation for attaining the same, the thickness of the silicon oxide layer on the region A1 is thicker than that on the region A2 and the impurity ions of the same conductivity type (N type) as that of the region A2 is implanted into the surface of the region A2 thereby to form an impurity layer 22 (FIG. 5). In an additional alternation, the conductive electrode 14 may be connected through a capacitor 23 to the second terminal 16, as shown in FIG. 6. In the above examples, the first and second regions 10 and 11 may be made by a P type semiconductor and an N type semiconductor. The negative resistance semiconductor element is suitable for a MOS structure fabrication and its power consumption is small.

Figure 7:
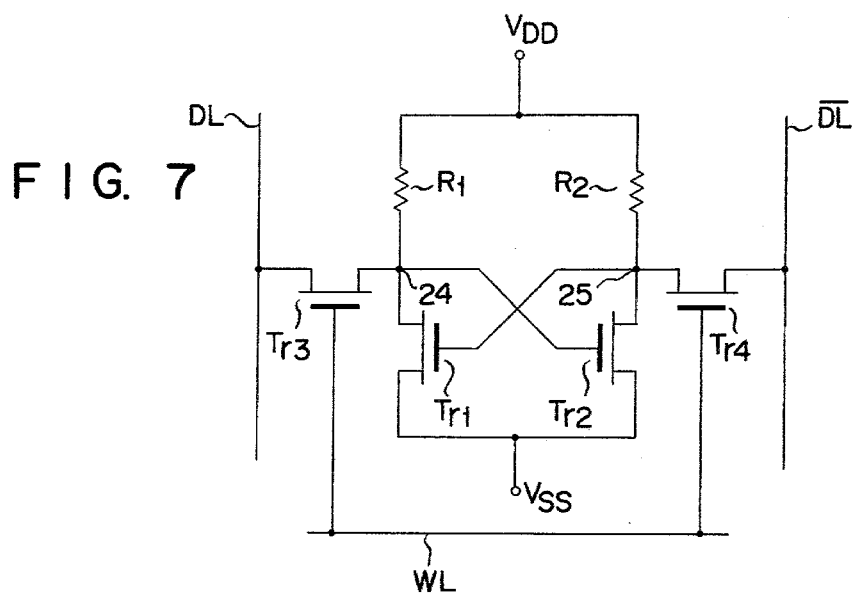
FIG. 7 shows a schematic diagram of a conventional static type memory cell.

A static type memory cell using the semiconductor negative resistance device according to the invention will be described. One of the currently marketed static type memory arrays has a memory capacity of 4 K bits/chip. FIG. 7 shows a unit memory cell in such a memory array. In the figure, Tr1 and Tr2 are transistors constituting an F.F circuit and Tr3 and Tr4 indicate switching transistors. The load resistors of the transistors Tr1 and Tr2 are denoted as R1 and R2, respectively. A couple of series circuits including resistor R1 and transistor Tr1, and resistor R2 and transistor Tr2 is inserted in parallel between first and second power sources $V_{DD}$ and $V_{SS}$, the nodes 24 and 25 of the FF circuit taking bistable states. As shown, bit lines DL and $\overline{DL}$ are connected through transistors Tr3 and Tr4 to the nodes 24 and 25, respectively, and the gates of the transistors Tr3 and Tr4 are coupled with a word line WL. As is known, a static memory is superior to a dynamic memory in that the former does not need a reflesh operation, unlike the latter.

The disadvantage of the static memory is that, since the number of circuit components per unit cell is large, the bit density is substantially ¼ of that of the dynamic type memory. The reason for this is that, in the case of the dynamic memory, at least two transistors are needed for attaining the bistable function and the negative resistance characteristic.

However, when the semiconductor element shown in FIG. 1 is used, a single semiconductor element can provide a negative resistance characteristic. Therefore, if such a semiconductor element is applied to the memory cell, the memory cell constructed has a smaller number of the elements, consumes low power and is well adapted for the integrated circuit fabrication.

Figure 8:
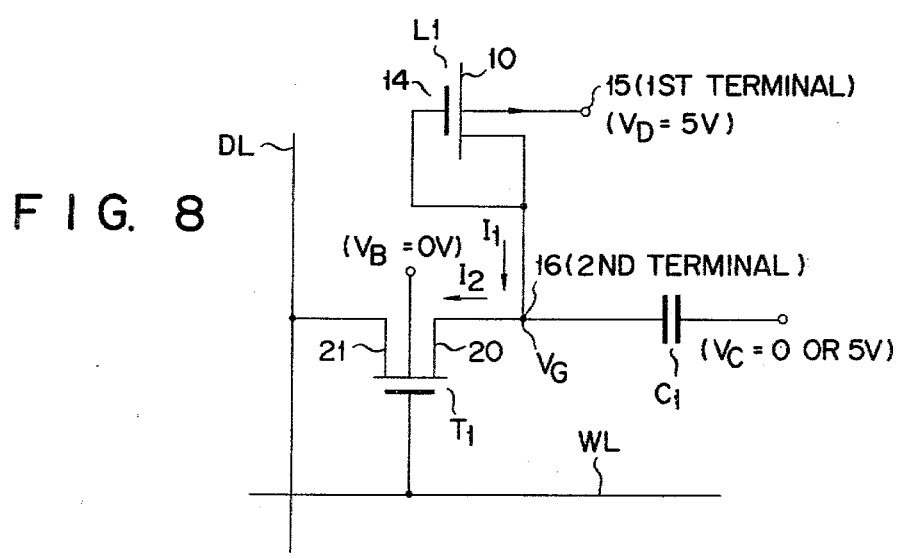
FIG. 8 shows a schematic circuit diagram of a static type memory cell using the negative resistance semiconductor element shown in FIG. 1.

Turning now to FIG. 8, there is shown a schematic diagram of a static memory cell using the negative resistance semiconductor element L1 according to the invention. In the figure, like numerals are used to designate like parts or portions shown in FIG. 1. The element L1 has a structure which is the same as that of the element shown in FIG. 1. The first terminal 15 of the element L1 is supplied with a first power source voltage, e.g. +5 V. The 2nd terminal 16 is coupled with a second power source voltage Vc, e.g. 0 V or +5 V through a capacitor C₁. The capacitor C₁ may be a capacitor intentionally provided or a stray capacitor. The second terminal 16 is also connected to the source 20 of an enhancement type transistor T₁. The drain 21 of the transistor T₁ is connected to a bit line DL and the gate is connected to a word line WL and the substrate is kept at a third power source voltage $V_B$, for example, 0 V.

Figure 9:
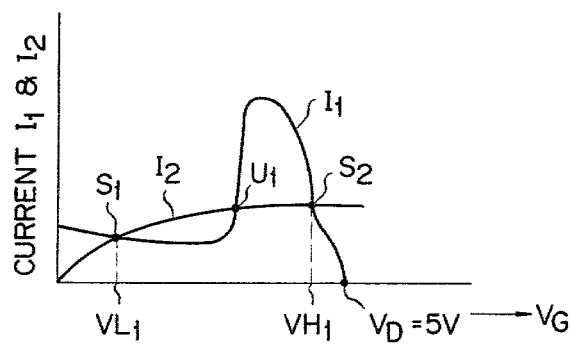
FIG. 9 shows a graph illustrating a characteristic of the memory cell shown in FIG. 8.

In operation, a current path is established between the 1st terminal 15 and a third power source $V_B$. When $V_D=5$ V and $V_B=0$ V, it is assumed that current I₁ flows from the negative resistance element L1 into the second terminal 16 (which is a memory terminal for storing information and is at a potential $V_G$) and a current I₂ leaks through a path between the source 20 and the substrate. In FIG. 9, the X-axis represents the potential $V_G$ at the second terminal and the Y-axis doubly represents currents I₁ and I₂. At the time point that the potential $V_G$ at the second terminal becomes below 5 V, an inverse current starts to flow into the element L1. And as the potential $V_G$ decreases, the inverse current I₁ changes as shown in FIG. 9, as described with reference to FIG. 3. The inverse current in FIG. 3 is denoted as i and that in FIG. 9 as I₁. The leak current I₂ flowing between the source 20 of the transistor T₁ and the substrate thereof changes as indicated by I₂ as the potential $V_G$ at the 2nd terminal decreases. In a steady state, the currents I₁ and I₂ are equal to each other. The cross points between the current curves I₁ and I₂ are represented by S₁, U₁ and S₂, respectively. In these cross points S₁ and S₂ indicate stable points, respectively, and the point U₁ unstable point. The initial voltage $V_G$ at the 2nd terminal 16 shifts toward voltage VL₁ or VH₁ corresponding to the stable point S₁ or S₂ when the initial voltage $V_G$ is located at the left or the right side with respect to the unstable point U₁. If the binary information "0" and "1" are properly assigned to the potentials VL₁ and VH₁, the binary information may be stored at the 2nd terminal 16 due to the stable points S₁ and S₂.

A means for loading information into the 2nd terminal 16 (referred to as a memory terminal) will be described. When the potential at the memory terminal 16 is VL₁ ("0"), a pulse is applied to the gate of the transistor T₁ by way of the word line WL so as to render the transistor T₁ conductive. If the bit line DL is at a level of VH₁ in this case, the level of the memory terminal 16 shifts from VL₁ ("0") to VH₁ ("1") as the conductance between the source and drain of the transistor T₁ is large and the memory terminal 16 takes a new stable state. In this case, a charge corresponding to the new potential VH₁ at the memory terminal 16 is stored into the capacitor C₁. After the abovementioned reading or writing operation is finished, the transistor T₁ is turned off to maintain the potential at the memory terminal 16 at VH₁. By the same way, information corresponding to VL₁ is also loaded and stored at the memory terminal 16.

When the information at the memory terminal 16 is read out the transistor T₁ is turned on by way of the word line WL. At this time, the potential on the bit line DL changes corresponding to the amount of charges stored in the capacitor C₁, thus the information at the memory terminal 16 is read out.

As described above, if the example shown in FIG. 8 is used, a static memory cell may be formed by only three of the negative resistance semiconductor element L1, the N-channel enchancement type transistor T₁ and the capacitor C₁. In case where a stray capacitor may be used as the capacitor C₁, only two elements can form a memory cell.

Figure 10:
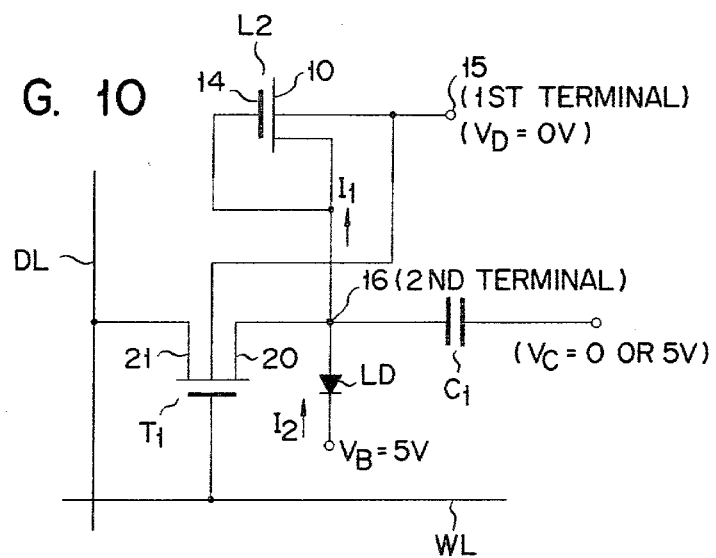
FIG. 10 shows schematic circuit diagram of another static type memory cell using the negative resistance semiconductor element according to the invention.

Turning now to FIG. 10, there is shown another embodiment of a memory cell including a single negative resistance semiconductor element L2. The different points of this example from the FIG. 8 example are that the first and second semiconductor regions 10 and 11 of the negative resistance semiconductor element L2 are of the P- and N-types (see FIG. 1) respectively and that the second terminal, i.e. the memory terminal 16 is connected to a power source $V_B$ through a high resistance element, e.g. a diode LD connected inversely. In this example, a first source voltage $V_D$ to be supplied to the first terminal of L2 is selected to be 0 V, a second source voltage $V_C$ to be 0 V or 5 V, and a third source voltage $V_B$ to be 5 V, respectively. The substrate of the transistor $T_1$ is coupled to the first terminal 15.

Figure 11:
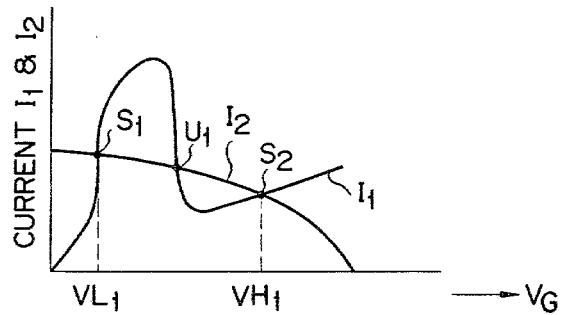
FIG. 11 shows a graph for illustrating a characteristic of the memory cell shown in FIG. 10.

The operation of the embodiment shown is FIG. 10 will be described as follows (FIG. 11). References are corresponded to those of FIG. 9 for omitting the descriptions thereof. A current $I_1$ flows between the memory terminal 16 and the first voltage source $V_D$ through the element L2 and a current $I_2$ flows between the third voltage source $V_B$ and the memory terminal 16 through the diode LD inversely connected. Among the intersections between the curves of the currents $I_1$ and $I_2$, $S_1$ and $S_2$ represent stable points and $U_1$ represents an unstable point. Means for writing information into the memory terminal 16 and means for reading out information $VL_1$ and $VH_1$ corresponding to the stable points $S_1$ and $S_2$ are already described referring to FIG. 8, thus the explanation thereof being omitted.

Figure 12:
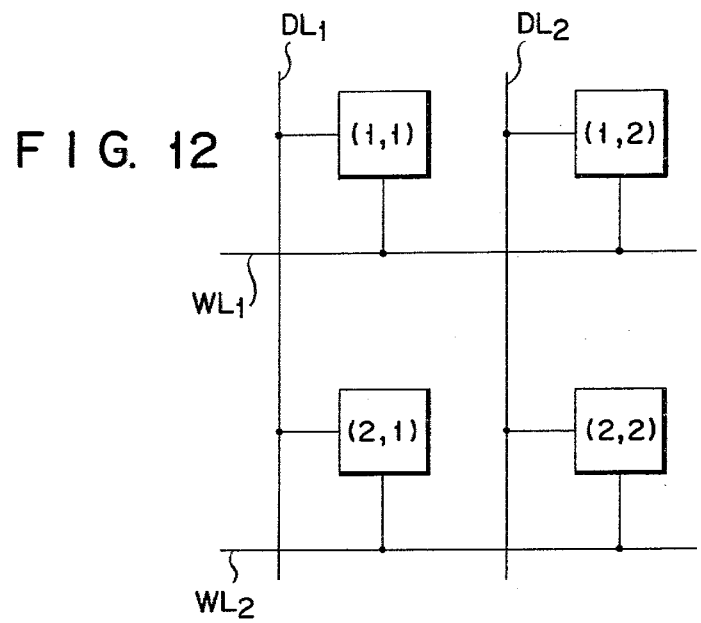
FIG. 12 shows a static type memory array including a plurality of memory cells shown in FIG. 8.

FIG. 12, which will be described, shows an example of a 4-bit memory array in which four unit memory cell's of FIG. 8 or FIG. 10 are arranged into two rows and two columns. In the figure, the memory cells arranged in row are represented by (1, 1), (1, 2) : (2, 1), (2, 2) and the memory cells in the column direction are represented by (1, 1), (2, 1) : (1, 2), (2, 2). In the figure, $DL_1$ and $DL_2$ represent bit lines, respectively, and $WL_1$ and $WL_2$ word lines, respectively.

Figure 13:
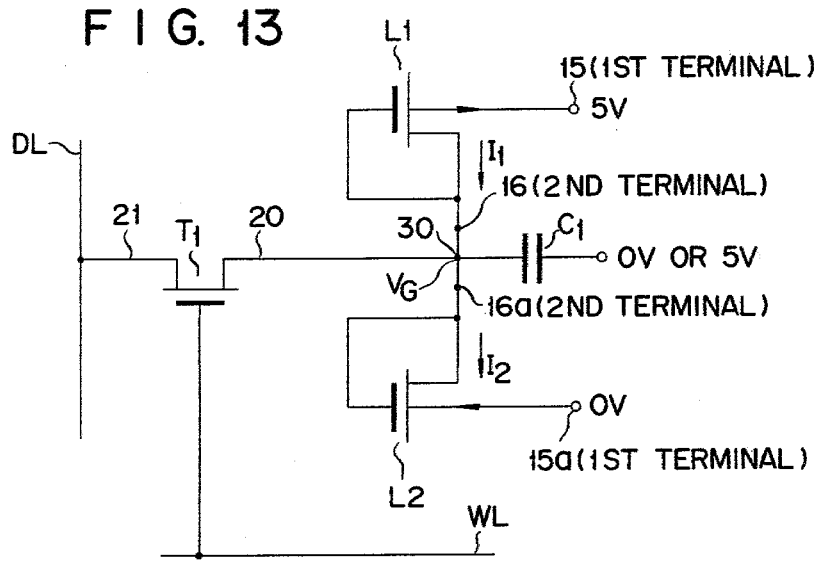
FIG. 13 shows a circuit diagram of a static type memory cell constructed by a semiconductor device according to the invention including a couple of negative resistance semiconductor elements which are different in conductivity type.

A static memory cell shown in FIG. 13 uses a semiconductor negative resistance semiconductor device which is the combination of a negative resistance semiconductor element L1 (in FIG. 1, the first region 10 is of N type and the second region 11 is of the P type and, in the present invention, it is called an P-channel negative resistance semiconductor element) and another negative resistance semiconductor element L2 (in FIG. 1, the first region 10 is of P type and the second region 11 is of N type and, in the present invention, it is called an N-channel negative resistance semiconductor element). 5 V is applied from a first power source to a first terminal 15 of the element L1. 0 V is applied from a third power source to a first terminal 15a of the element L2. The second terminal 16 of the element L1 and the second terminal 16a of the element L2 are connected to a memory terminal 30. The memory terminal 30 is connected to a second power source of 0 V or 5 V, by way of a capacitor $C_1$. The memory terminal 30 is also connected to the source 20 of the transistor $T_1$. The transistor $T_1$ is connected at the drain 21 to the bit line DL and at the gate to the word line WL. The transistor $T_1$ is a switching transistor which may be of N- or P-channel enhancement type.

Figure 14:
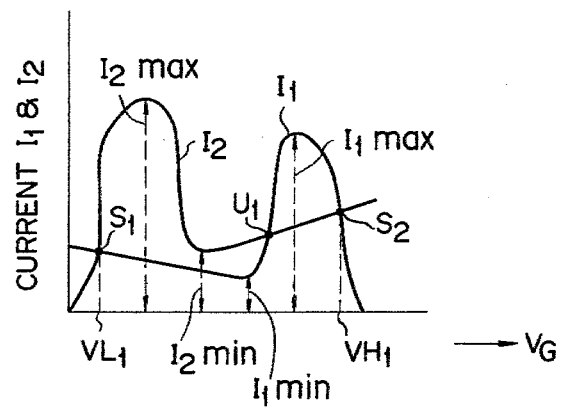
FIGS. 14 and 15 show graphs for explaining characteristics of the memory cell shown in FIG. 13.
Figure 15:
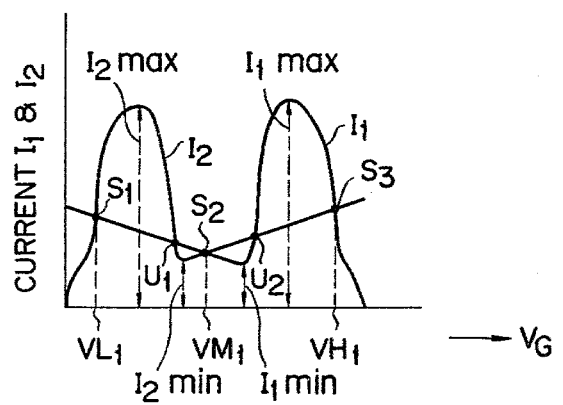

In the graphs shown in FIGS. 14 and 15, the X-coordinate axis represents a potential $V_G$ at the memory terminal 30 (FIG. 3) and the Y-coordinate axis represents currents $I_1$ and $I_2$. Here, the current $I_1$ indicates a current flowing between the first terminal 15 of the element L1 and the second terminal 16. The current $I_2$ indicates a current flowing between the second terminal 16a of the element L2 and the first terminal 15a. Assume that the maximum value of the current $I_1$ flowing through the element L1 (P-channel) is represented by $I_{1max}$, the minimum value is represented by $I_{1min}$, the maximum value of the current $I_2$ flowing through the element L2 (N-channel) is denoted as $I_{2max}$ and the minimum value as $I_{2min}$. On this assumption, when $I_{1min} >> I_{2min}$ or $I_{1min} << I_{2min}$, the stable operation point of the memory terminal 30 is positioned at one of the points $S_1$ and $S_2$ having stable potentials $VL_1$ and $VH_1$. $U_1$ denotes an unstable point. As described previously referring to FIG. 9, the potential at the memory terminal 30 shifts toward the stable point $S_1$ or $S_2$ when the initial potential at the memory terminal 30 is located at the left or right side with respect to the unstable point $U_1$, so that the stable potential becomes $VL_1$ or $VH_1$. In the example shown in FIG. 13, it is very easy to obtain the stable point $S_1$ or $S_2$.

If the relation $I_{1min} \approx I_{2min}$ is satisfied, the memory terminal 30 in FIG. 13 has three stable points $S_1$ to $S_3$ and two unstable points $U_1$ and $U_2$, as shown in FIG. 15. The potential at the memory terminal 30 settles into a proper potential of $VL_1$, $VM_1$ and $VH_1$, depending on which side of the unstable point $U_1$ or $U_2$ the initial voltage of the memory terminal 30 is located. With such a characteristic as shown in FIG. 15, the circuit shown in FIG. 13 can store ternary information.

When information is loaded into the memory cell shown in FIG. 13, the switching transistor is turned on through the word line WL and, after the potential $VL_1$ or $VH_1$ (FIG. 14), $VL_1$ or $VM_1$ or $VH_1$ (FIG. 15) is applied to the memory terminal 30, the transistor $T_1$ is turned off. When the information at the memory terminal 30 is read out, the transistor $T_1$ is turned on through the word line WL. Upon the turning on of the transistor $T_1$, the charge stored in the capacitor $C_1$ which represents the information at the memory terminal 30 is read out onto the bit line DL.

The negative resistance semiconductor device is applicable for not only the memory cell array shown in FIG. 12 but also for a part of a dynamic logic circuit of MOS type or bipolar type for the purpose of providing a static operation stable point to such a logic circuit.

What is claimed is:

1. A negative resistance semiconductor device comprising at least one negative resistance semiconductor element, said negative resistance semiconductor element including:

first and second semiconductor regions of first and second conductivity types, these forming a PN junction;

a conductive electrode which is provided at least on the surface of said first semiconductor region with an insulating layer intervening therebetween, and is electrically coupled with said second semiconductor region;

a first terminal connected to said first semiconductor region;

a second terminal connected to said second semiconductor region;

structual means which provides a first positive resistance characteristic at said PN junction when an inverse bias voltage of a first voltage range is applied across said PN junction through said first and second terminals, provides a negative resistance characteristic at said PN junction when an inverse bias voltage of a second voltage range is applied therecross, and provides a second positive resistance characteristic at said PN junction when an inverse voltage of a third voltage range is applied thereacross; wherein said first positive resistance characteristic is obtained by forming a depletion layer continuous from said PN junction to the surface of said first semiconductor region adjacent said conductive electrode, and said negative resistance characteristic is obtained by forming an inversion layer of the second conductivity type which is on said depletion layer formed on the surface of said first semiconductor region adjacent said conductive electrode and is at a location separated from said PN junction.

2. A negative resistance semiconductor device according to claim 1, wherein said structual means includes a region doped with an impurity of the first conductivity type which is provided on the surface of a first subregion of the first conductivity type between said PN junction and the region where said inversion layer is to be formed thereon, and a region doped with an impurity of the second conductivity type which is formed on the surface of said region doped with said first conductivity type impurity.

3. A negative resistance semiconductor device according to claim 2, wherein said region doped with the first conductivity type impurity and the region doped with the second conductivity type impurity are formed by impurity ion implantation means.

4. A negative resistance semiconductor device according to claim 1, wherein said structual means includes means for forming the insulating layer on said first semiconductor region on which said inversion layer is formed thinner than that of the remaining insulating layer.

5. A negative resistance semiconductor device according to claim 4, wherein an impurity region of the first conductivity type is further formed on the surface of said first semiconductor region where said inversion layer is formed.

6. A negative resistance semiconductor device according to claim 1, wherein said conductive electrode and said second semiconductor region are directly coupled each other.

7. A negative resistance semiconductor device according to claim 1, wherein said conductive electrode and said second semiconductor region are connected through a capacitor.

8. A negative resistance semiconductor device according to claim 1, wherein said first terminal is connected to a first power source, said second terminal is connected through a MOS transistor to a bit line and is further connected through a capacitor to a second power source, and the gate of said MOS transistor is connected to a word line and the substrate of said MOS transistor is connected to a third power source.

9. A negative semiconductor device according to claim 1, wherein said first terminal is connected to a first power source, said second terminals is connected through a MOS transistor to a bit line and is connected through a capacitor to a second power source, and is further connected through a high resistance resistor to a third power source, and the gate of said MOS transistor is connected to a word line, and the substrate of said MOS transistor is connected to said first power source.

10. A negative semiconductor device according to claim 1, in which a first and second negative resistance semiconductor elements are included; said first negative resistance semiconductor elements having said first semiconductor region of N type; said second negative resistance semiconductor element having said first semiconductor region of P type; first terminals of said first and second elements being connected to first and second power sources respectively; second terminals of said first and second elements being connected commonly to a third power source through a capacitor and being also connected through a MOS transistor to a bit line; and the gate of said MOS transistor being connected to a word line.

* * * * *